(12) United States Patent
Suzuki et al.

(10) Patent No.: US 11,558,968 B2
(45) Date of Patent: Jan. 17, 2023

(54) ELECTRONIC UNIT

(71) Applicant: Yazaki Corporation, Tokyo (JP)

(72) Inventors: Masashi Suzuki, Makinohara (JP); Jun Goto, Makinohara (JP)

(73) Assignee: Yazaki Corporation, Tokyo (JP)

( * ) Notice: Subject to any disclaimer, the term of this patent is extended or adjusted under 35 U.S.C. 154(b) by 152 days.

(21) Appl. No.: 17/172,772

(22) Filed: Feb. 10, 2021

(65) Prior Publication Data

US 2021/0251091 A1 Aug. 12, 2021

(30) Foreign Application Priority Data

Feb. 10, 2020 (JP) ............................. JP2020-020625

(51) Int. Cl.
*H05K 5/00* (2006.01)
*H05K 5/02* (2006.01)
*H01R 12/75* (2011.01)
*H01R 13/627* (2006.01)
*H05K 1/14* (2006.01)

(52) U.S. Cl.
CPC ......... *H05K 5/0069* (2013.01); *H05K 5/0221* (2013.01); *H01R 12/75* (2013.01); *H01R 13/6272* (2013.01); *H05K 1/144* (2013.01)

(58) Field of Classification Search
CPC .... H05K 5/0069; H05K 5/0221; H05K 1/144; H01R 12/75; H01R 13/6272
USPC .......................................................... 439/55
See application file for complete search history.

(56) References Cited

U.S. PATENT DOCUMENTS

| | | | | |
|---|---|---|---|---|
| 6,049,467 A | * | 4/2000 | Tamarkin | H05K 1/144 257/713 |
| 2007/0298636 A1 | * | 12/2007 | Kusuda | H01R 13/6335 439/150 |
| 2011/0211314 A1 | * | 9/2011 | Hong-Chi | H05K 1/0203 361/718 |
| 2015/0349471 A1 | | 12/2015 | Maki et al. | |
| 2019/0074641 A1 | | 3/2019 | Maki et al. | |
| 2020/0153174 A1 | * | 5/2020 | Curtis | H01R 4/184 |
| 2020/0244025 A1 | * | 7/2020 | Winey | H01R 43/26 |
| 2021/0251091 A1 | * | 8/2021 | Suzuki | H05K 5/0221 |
| 2021/0307189 A1 | * | 9/2021 | Lucero | H05K 7/1422 |

(Continued)

FOREIGN PATENT DOCUMENTS

JP 2011-076972 A 4/2011
JP 4782230 B2 9/2011

(Continued)

*Primary Examiner* — Alexander Gilman
(74) *Attorney, Agent, or Firm* — Banner & Witcoff, Ltd.

(57) ABSTRACT

An electronic unit includes a first board and a second board which are stacked on each other, a first connector mounted on a surface of the first board which faces the second board, and a second connector mounted on a surface of the second board which faces the first board. Each of the first connector and the second connector has a fitting portion and a lock portion configured to lock a fitting of the fitting portion. The fitting portion and the lock portion of the first connector are provided between the first board and the second board in a stack direction in which the first board and the second board are stacked. The fitting portion and the lock portion of the second connector are provided between the first board and the second board in the stack direction.

3 Claims, 4 Drawing Sheets

(56) References Cited

U.S. PATENT DOCUMENTS

2021/0351532 A1* 11/2021 Nakajima .......... H01R 13/2407
2021/0376539 A1* 12/2021 Maejima ............ H01R 13/6594

FOREIGN PATENT DOCUMENTS

| JP | 2016-015809 A | 1/2016 |
| JP | 2018-052229 A | 4/2018 |

* cited by examiner

ELECTRONIC UNIT

CROSS REFERENCE TO RELATED APPLICATIONS

This application is based on Japanese Patent Application No. 2020-020625 filed on Feb. 10, 2020, the contents of which are incorporated herein by reference.

BACKGROUND OF THE INVENTION

1. Field of the Invention

The present disclosure relates to an electronic unit having boards each of which is mounted with a connector.

2. Description of the Related Art

Electronic units having a board that is mounted with many connectors (refer to JP-A-2016-15809, JP-A-2011-76972 and JP-A-2018-52229) require a wide-area board because the board is mounted with a relatively large number of electronic components. In view of this, it has been proposed to stack plural boards 100 as shown in FIG. 5 to decrease the size (projection area) of each board 100. In this case, the electronic unit is increased in height if the boards 100 are simply stacked and a top connector 200 and a bottom connector 200 are both mounted on the respective boards 100 on their top sides.

One countermeasure is shown in FIG. 6 in which an electronic unit is decreased in height by mounting a top connector 200 and a bottom connector 200 on the bottom surface and the bottom surface of a board 100, respectively. However, in this case, if the connectors 200 have the same shape, a manipulation member 300 for performing an unlocking manipulation on the top connector 200 is located below a counterpart connector 400 and a manipulation member 300 for performing an unlocking manipulation on the bottom connector 200 is located above a counterpart connector 400. This raises a problem that it is difficult for a worker to manipulate the manipulation members 300 in maintenance work.

SUMMARY OF THE INVENTION

The present disclosure has been made in view of the above circumstances in the art, and an object of the disclosure is therefore to provide an electronic unit that can be miniaturized and makes it easier to perform unlocking manipulations on connectors in maintenance work.

To attain the above object, the disclosure provides an electronic unit having the following features:

an electronic unit including:

a first board and a second board which are stacked to each other;

a first connector mounted on a surface of the first board which faces the second board; and a second connector mounted on a surface of the second board which faces the first board, in which:

each of the first connector and the second connector has a fitting portion to be fitted with a first counterpart connector or a second counterpart connector and a lock portion configured to lock a fitting of the fitting portion;

the fitting portion and the lock portion of the first connector are provided between the first board and the second board in a stack direction in which the first board and the second board are stacked; and the fitting portion and the lock portion of the second connector are provided between the first board and the second board in the stack direction.

As described above, the disclosure can provide an electronic unit that can be miniaturized and allows a worker to easily perform manipulations for unlocking connectors in maintenance work.

The disclosure has been described above concisely. The details of the disclosure will become more apparent when the mode for carrying out the disclosure (hereinafter referred to as an embodiment) described below is read through with reference to the accompanying drawings.

DETAILED DESCRIPTION OF THE EXEMPLARY EMBODIMENTS

A specific embodiment of the present disclosure will be hereinafter described with reference to the drawings.

Figure 1:
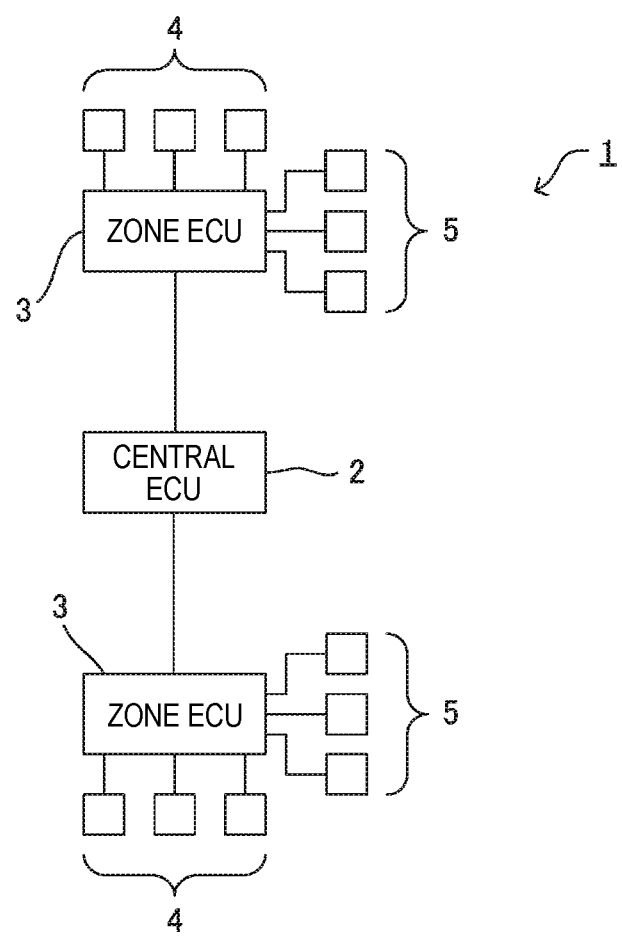
FIG. 1 is a block diagram of a communication system incorporating zone ECUs as electronic units according to the present disclosure.

FIG. 1 is a block diagram of a communication system 1 incorporating zone ECUs 3 as electronic units according to the disclosure. The communication system 1 according to the disclosure is provided in a vehicle. The communication system 1 is equipped with a central ECU 2 as a control device and the zone ECUs 3 as electronic units.

The central ECU 2 is a microcomputer having a CPU and is provided in, for example, the instrument panel of a vehicle. The central ECU 2 controls the entire communication system 1.

The zone ECUs 3 are provided in respective areas (e.g., left door and right door) of a vehicle. Each zone ECU 3 controls standard electric devices 4 and extended electric devices 5 provided in the corresponding area according to instructions from the central ECU 2 by communicating with the central ECU 2. The standard electric devices 4 are electric devices (air-conditioning unit, power window unit, etc.) that are installed in common in target vehicles. The extended electric devices 5 are electric devices that are selectively installed in target vehicles according to their specifications. The extended electric devices 5 may be installed either at the time of or after shipment of a vehicle.

Figure 2:
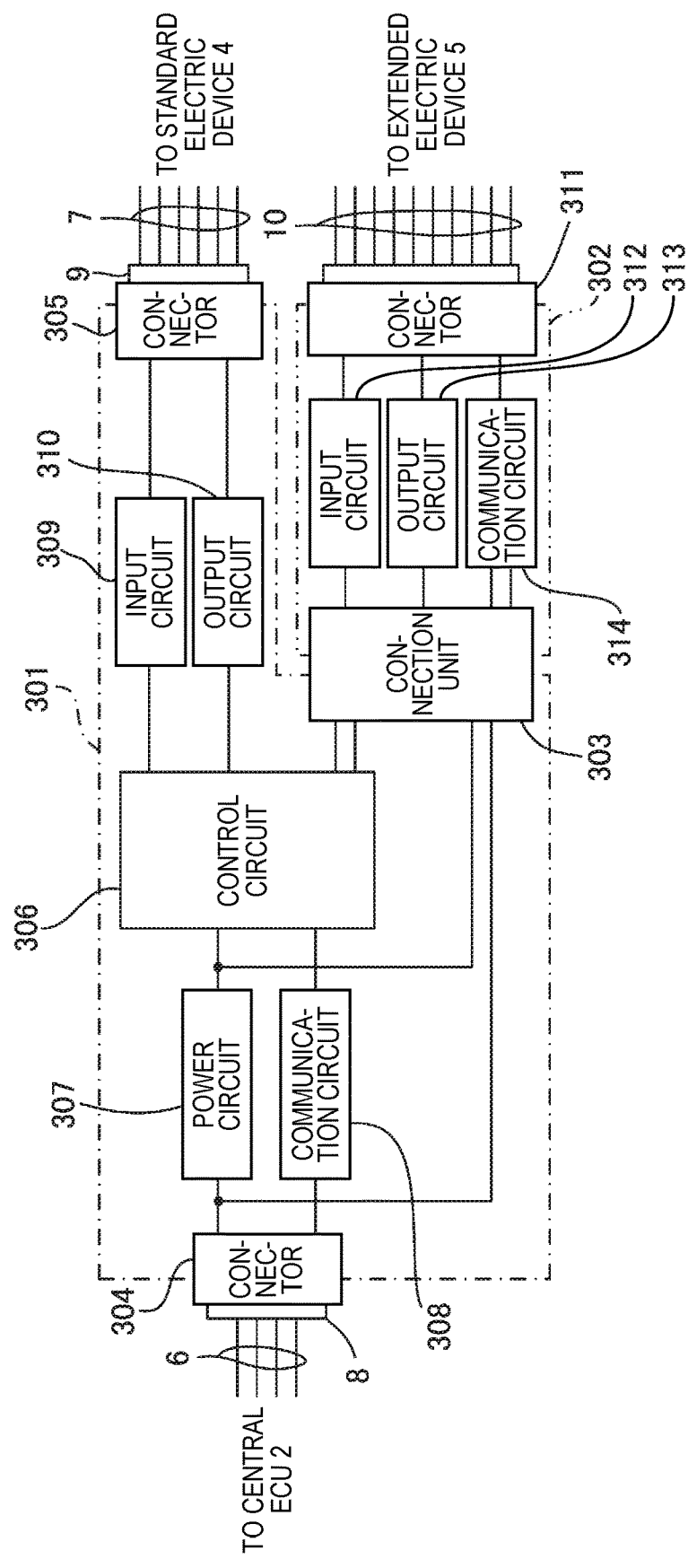
FIG. 2 is a detailed circuit diagram of each zone ECU shown in FIG. 1.

Next, the electrical configuration of each zone ECU 3 will be described with reference to FIG. 2. As shown in FIG. 2, each zone ECU 3 is equipped with a standard board 301 (second board) for operating the standard electric devices 4, an extension board 302 (first board) for operating the extended electric devices 5, and a connection unit 303 for connecting the standard board 301 and the extension board 302. Where the zone ECU 3 is installed in a standard equipment target vehicle to be equipped with only the standard electric devices 4, the extension board 302 is not connected to the standard board 301.

When extension from current electric devices is desired, the extended electric devices 5 are operated by connecting the extension board 302 to the standard board 301 as shown in FIG. 2. An extension board 302 is prepared that corresponds to each of different combinations of extended electric devices 5 for respective target vehicle specifications. An extension board 302 corresponding to a target vehicle specification is connected to the standard board 301 at the time of shipment.

The standard board 301 is equipped with plural connectors 304 and 305, a control circuit 306, a power circuit 307, a communication circuit 308, etc. The connector 304 is connected directly to a counterpart connector 8 which is provided in a terminal of a wire harness 6. The wire harness 6 is connected to the central ECU 2. The connector 305 is connected directly to a counterpart connector 9 which is provided in a terminal of a wire harness 7. The wire harness 7 is connected to the standard electric devices 4.

For example, the control circuit 306 is a microcomputer having a CPU. The control circuit 306 controls the standard electric devices 4 and the extended electric devices 5 according to instructions from the central ECU 2 by communicating with the central ECU 2. The power circuit 307 generates power for the control circuit 306 on the basis of power that is supplied via the connector 304. The communication circuit 308 is a circuit for performing modulation, demodulation, etc. on communication signals that are exchanged between the central ECU 2 and the control circuit 306.

The standard board 301 is provided with various kinds of circuits that are suitable for the kinds of standard electric devices 4 (in the example of FIG. 2, one input circuit 309 and one output circuit 310 are provided). For example, where the standard electric devices 4 are devices (e.g., sensors) for inputting measurement values or the like to the control circuit 306, the input circuit 309 is provided for those standard electric devices 4. Where the standard electric devices 4 are devices (e.g., motors and lamps) that operate according to outputs of the control circuit 306, the output circuit 310 is provided for those standard electric devices 4. Where the standard electric devices 4 are devices that communicate with the control circuit 306, a communication circuit (not shown) may be provided for those standard electric devices 4.

The extension board 302 can be connected selectively to the standard board 301 by the connection unit 303. The extension board 302 is provided with a connector 311 etc. The connector 311 is connected directly to a counterpart connector 11 which is provided in a terminal of a wire harness 10. The wire harness 10 is connected to the extended electric devices 5. Similarly to the standard board 301, the extension board 302 is provided with various kinds of circuits that are suitable for the kinds of extended electric devices 5 (in the example of FIG. 2, one input circuit 312, one output circuit 313, and one communication circuit 314 are provided).

Figure 3:
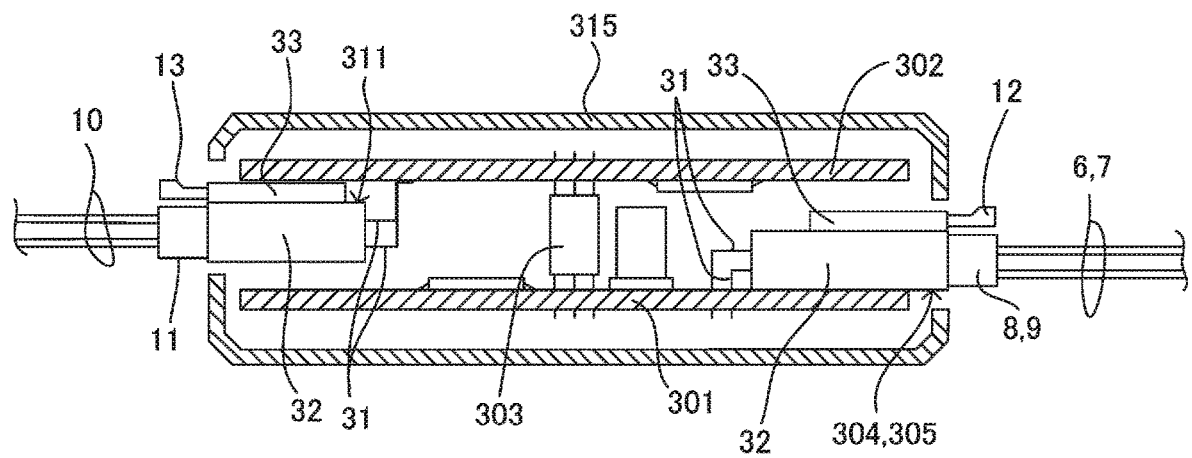
FIG. 3 is a rough sectional view of the zone ECU shown in FIG. 2.

Next, the configuration of the zone ECU 3 will be described with reference to FIG. 3. As shown in FIG. 3, and the extension board 302 are stacked and housed in a housing case 315. The connectors 304 and 305 to be mounted on the standard board 301 are mounted on the surface (top surface), opposed to the extension board 302, of the standard board 301. The connector 311 to be mounted on the standard board 302 is mounted on the surface (bottom surface), opposed to the standard board 301, of the extension board 302.

Each of the connectors 304, 305, and 311 has terminal metal fittings 31, a fitting portion 32 which houses the terminal metal fittings 31 and is to be fitted with a counterpart connector 8, 9, or 11, and a lock portion 33 for locking the fitting of the fitting portion 32. One end portion of each terminal metal fitting 31 is housed in the fitting portion 32 and is fitted in and electrically connected to a corresponding terminal metal fitting (not shown) of the counterpart connector 8, 9, or 11. The other end portion of each terminal metal fitting 31 projects outward from the fitting portion 32 and is connected to the board 301 or 302.

In the embodiment, the fitting portion 32 is made of a synthetic resin or the like and the counterpart connector 8, 9, or 11 is fitted in it. However, the fitting portion 32 is not limited to this type and may be such as to be fitted in the counterpart connector 8, 9, or 11. An inlet, in which the counterpart connector 8, 9, or 11 is fitted, of the fitting portion 32 is exposed in an opening of the housing case 315.

Figure 4:
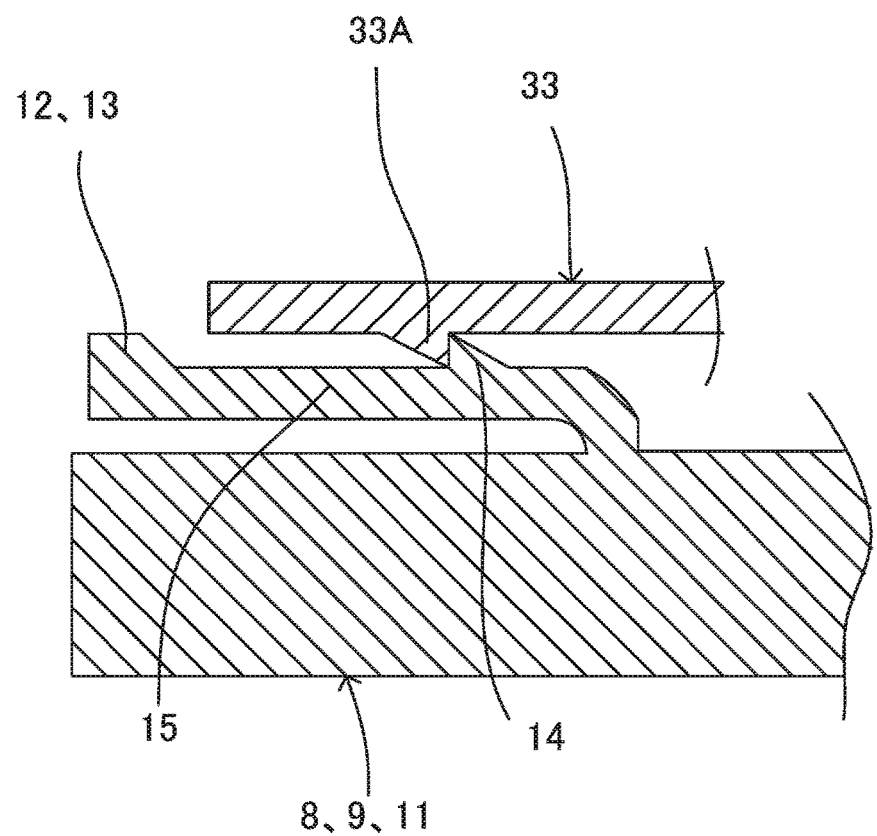
FIG. 4 is a rough sectional view of a part, around a lock portion, of FIG. 2.
Figure 5:
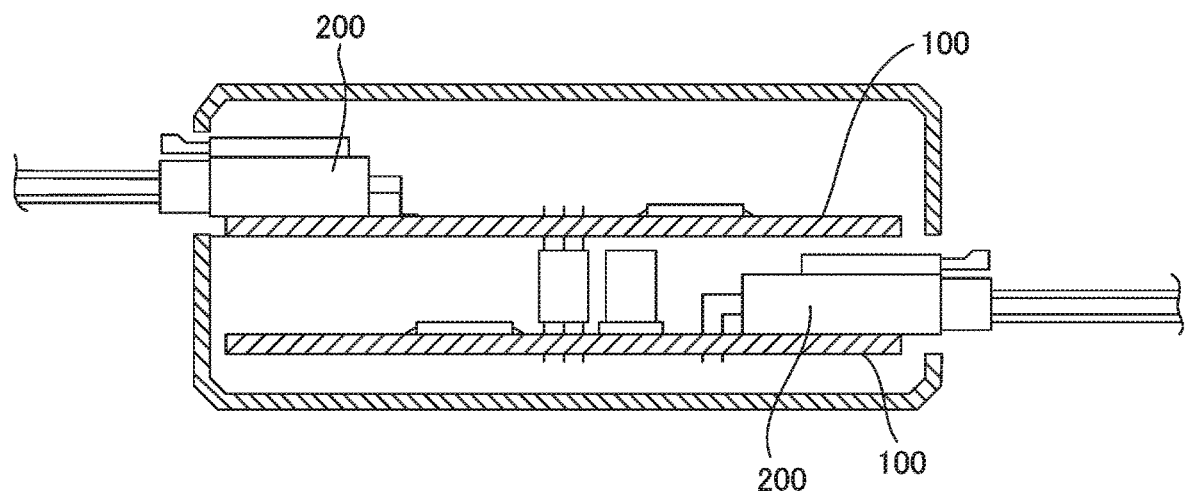
FIG. 5 is a sectional view of an example conventional electronic unit.
Figure 6:
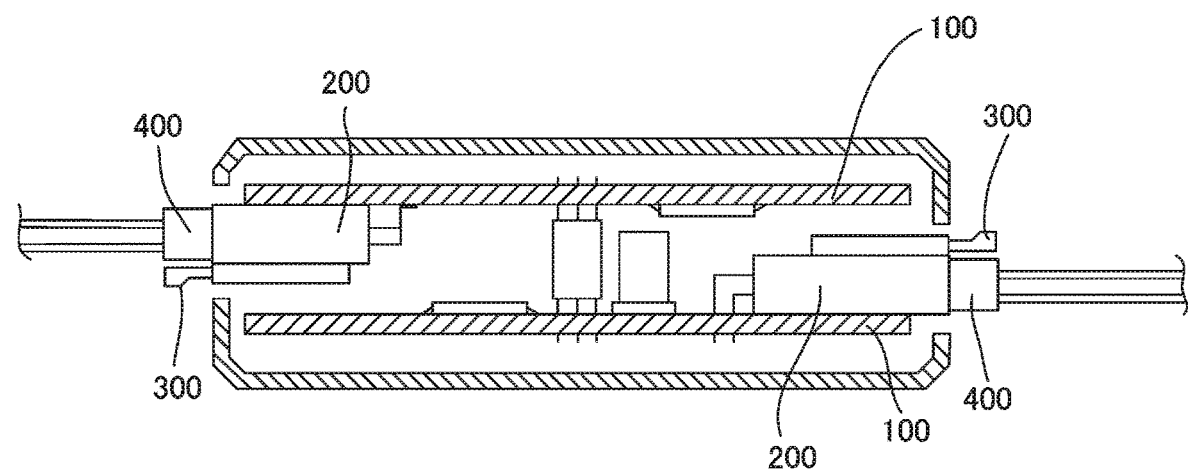
FIG. 6 is a sectional view of another example conventional electronic unit.

The lock portion 33 is made of a synthetic resin or the like so as to be integrated with the fitting portion 32. As shown in FIG. 4, for example, the lock portion 33 has a projection 33A which projects toward the counterpart connector 8, 9, or 11. The projection 33A is locked on a projection 14 of the counterpart connector 8, 9, or 11 and thereby locks the counterpart connector 8, 9, or 11. The lock portions 33 of the respective connectors 304, 305, and 311 are provided on the same side of the standard board 301 and the extension board 302 in the stacking direction with respect to the respective fitting portions 32. That is, each of the connectors 304 and 305 which are mounted on the standard board 301 is provided with the lock portion 33 on the opposite side (top side in FIG. 3) of the fitting portion 32 to the standard board 301. On the other hand, the connector 311 which is mounted on the extension board 302 is provided with the lock portion 33 on the same side (top side in FIG. 3) of the fitting portion 32 as the extension board 302 is provided.

In the embodiment, the projection 14 of the counterpart connector 8, 9, or 11 projects from a lock arm 15 which is shaped like a cantilever. A free end portion of the lock arm 15 is formed with a manipulation portion 12 (second manipulation portion) or a manipulation portion 13 (first manipulation portion) on which a manipulation for unlocking the lock portion 33 is to be performed. As shown in FIG. 3, each of the manipulation portions 12 and 13 is set outside the space defined between the standard board 301 and the extension board 302 in a state that the connector 304, 305, or 311 is fitted with the counterpart connector 8, 9, or 11.

In the above-described embodiment, the standard board 301 and the extension board 302 are stacked. Furthermore, the connector 311 is mounted on the surface, located on the side of the standard board 301, of the extension board 302 and the connectors 304 and 305 are mounted on the surface, located on the side of the extension board 302, of the standard board 301. This structure makes it possible to miniaturize each zone ECU 3. The lock portions 33 of the connectors 304, 305, and 311 are provided on the same side of the fitting portions 32 in the stacking direction. This structure allows a worker to easily perform a manipulation for unlocking each of the connectors 304, 305, and 311 in maintenance work because all of the manipulation portions 12 and 13 are provided on the same side, in the stacking direction, of the fitting portions 32 and the counterpart connectors 8, 9, and 11 to be fitted in the respective fitting portions 32.

In the above-described embodiment, each of the manipulation portions 12 and 13 is set outside the space defined between the standard board 301 and the extension board 302. This structure allows a worker to perform, more easily, a manipulation for unlocking each of the connectors 304, 305, and 311 in maintenance work because the standard board 301 or the extension board 302 does not interfere with a manipulation on any of the manipulation portions 12 and 13.

Furthermore, in the above-described embodiment, the standard board 301 and the extension board 302 are stacked. This structure can suppress size increase of each zone ECU 3 even when the extension board 302 is connected to the standard board 301 to extend usable electric devices by connecting the extended electric devices 5.

Although in above-described embodiment the two boards, that is, the standard board 301 and the extension board 302, are stacked, the disclosure is not limited to this case. Three or more boards may be stacked; among the three or more boards, at least two adjacent boards should have the configuration of the above-described embodiment.

Although in above-described embodiment the manipulation portions 12 and 13 are provided in the respective counterpart connectors 8, 9, and 11, the disclosure is not limited to this case. The manipulation portions 12 and 13 may be provided in the respective connectors 304, 305 and 311.

Although in above-described embodiment the standard board 301 and the extension board 302 are stacked, the disclosure is not limited to this case. Two divisional boards of the standard board 301 may be stacked.

Furthermore, although in above-described embodiment the electronic unit according to the disclosure is incorporated in the communication system 1 in the form of each zone ECU 3, the disclosure is not limited to this case. It suffices that the electronic unit according to the disclosure be an electronic unit having boards each of which is mounted with a connector; the electronic unit according to the disclosure need not always be one incorporated in a communication system.

Features of the above-described electronic unit according the embodiment of the disclosure will be summarized concisely below in the form of items [1] to [3]:

[1] An electronic unit (3) comprising:
a first board (302) and a second board (301) which are stacked to each other;
a first connector (311) mounted on a surface of the first board (302) which faces the second board (301); and
a second connector (304, 305) mounted on a surface of the second board (301) which faces the first board (302), wherein:
each of the first connector (311) and the second connector (304, 305) has a fitting portion (32) to be fitted with a first counterpart connector (11) or a second counterpart connector (8, 9) and a lock portion (33) configured to lock a fitting of the fitting portion (32);
the fitting portion (32) and the lock portion (33) of the first connector (311) are provided between the first board (302) and the second board (301) in a stack direction in which the first board (302) and the second board (31) are stacked; and
the fitting portion (32) and the lock portion (33) of the second connector (304, 305) are provided between the first board (302) and the second board (301) in the stack direction.

[2] The electronic unit (3) according to item [1], wherein:
a first manipulation portion (13) for unlocking the lock portion (33) of the first connector (311) is provided on the first connector (311);
a second manipulation portion (12) for unlocking the lock portion (33) of the second connector (304, 305) is provided on the second connector (304, 305);
the first manipulation portion (13) is located outside a space defined between the first board (302) and the second board (301) when the first connector (311) is fitted with the first counterpart connector (11); and
the second manipulation portion (12) is located outside the space defined between the first board (302) and the second board (301) when the second connector (304, 305) is fitted with the second counterpart connector (8, 9).

[3] The electronic unit (3) according to item [1] or [2], further including:
a connection unit (303) that connects the first board (302) and the second board (301), in which:
the first board (302) is an extension board which is mounted with the first connector (311) to be connected to an extended electric device (5); and
the second board (301) is a standard board which is mounted with a plurality of the second connectors (304, 305) each of which is to be connected to a control device (2) or a standard electric device (4) and a control circuit (306) which controls the standard electric device (4) and the extended electric device (5) by communicating with the control device (2).

In the electronic unit having the configuration of item [1], the first board and the second board are stacked. Furthermore, the first connector is mounted on the surface of the first board which faces the second board and the second connector is mounted on the surface of the second board which faces the first board. This structure makes it possible to miniaturize the electronic unit. The lock portions and the fitting portions of the first connector and the second connector are provided between the first board and the second board in the stack direction. This structure allows a worker to easily perform a manipulation for unlocking each of the first connector and the second connector in maintenance work.

In the electronic unit having the configuration of item [2], each of the first manipulation portion and the second manipulation portion is set outside the space defined between the first board and the second board. This structure allows a worker to perform, more easily, a manipulation for unlocking each of the first connector and the second connector in maintenance work because the first board and the second board do not interfere with manipulations on the first manipulation portion and the second manipulation portion, respectively.

The electronic unit having the configuration of item [3] makes it possible to suppress size increase of the electronic unit even when an extension board is connected to a standard board to extend usable electric devices.

What is claimed is:
1. An electronic unit comprising:
a first board and a second board which are stacked on each other;
a first connector mounted on a surface of the first board which faces the second board; and
a second connector mounted on a surface of the second board which faces the first board, wherein:
each of the first connector and the second connector has a fitting portion to be fitted with a first counterpart connector or a second counterpart connector and a lock portion configured to lock a fitting of the fitting portion;
the first connector is provided with the lock portion on the same side of the fitting portion as the first board; and
the second connector is provided with the lock portion on the opposite side of the fitting portion to the second board.

2. The electronic unit according to claim 1, wherein:
a first manipulation portion for unlocking the lock portion of the first connector is provided on the first connector;
a second manipulation portion for unlocking the lock portion of the second connector is provided on the second connector;
the first manipulation portion is located outside a space defined between the first board and the second board when the first connector is fitted with the first counterpart connector; and
the second manipulation portion is located outside the space defined between the first board and the second board when the second connector is fitted with the second counterpart connector.

3. The electronic unit according to claim 1, wherein the second connector is one of a plurality of second connectors, the electronic unit further comprising:
a connection unit that connects the first board and the second board, wherein:
the first board is an extension board which is mounted with the first connector to be connected to an extended electric device; and
the second board is a standard board which is mounted with the plurality of the second connectors each of which is to be connected to a control device or a standard electric device and a control circuit which controls the standard electric device and the extended electric device by communicating with the control device.

\* \* \* \* \*